(12) United States Patent
Hshieh et al.

(10) Patent No.: US 6,518,127 B2
(45) Date of Patent: Feb. 11, 2003

(54) TRENCH DMOS TRANSISTOR HAVING A DOUBLE GATE STRUCTURE

(75) Inventors: Fwu-Iuan Hshieh, Saratoga, CA (US); Koon Chong So, Fremont, CA (US); Yan Man Tsui, Union City, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 09/872,886

(22) Filed: Jun. 1, 2001

(65) Prior Publication Data

US 2001/0023961 A1 Sep. 27, 2001

Related U.S. Application Data

(62) Division of application No. 09/531,138, filed on Mar. 17, 2000.

(51) Int. Cl.⁷ .............................................. H01L 21/336
(52) U.S. Cl. ...................... 438/270; 438/242; 438/259; 257/329; 257/330
(58) Field of Search ................................. 438/242, 259, 438/270, 271, 589; 257/328, 329, 330, 331, 332, 302, 335, 339, 488

(56) References Cited

U.S. PATENT DOCUMENTS

| | | | |
|---|---|---|---|
| 5,072,266 A | 12/1991 | Bulucea et al. ............. 357/23.4 |
| 5,164,325 A | 11/1992 | Cogan et al. ................. 437/29 |
| 5,298,781 A | * 3/1994 | Cogan et al. ................ 257/333 |
| 6,194,741 B1 | * 2/2001 | Kinzer et al. ................. 257/77 |

FOREIGN PATENT DOCUMENTS

WO   WO 94 03922   2/1994   ......... H01L/21/265

OTHER PUBLICATIONS

Baba Y., et al., "A Study on a High Blocking Voltage UMOS–FET With A Double Gate Structure", *Proceedings of the 4th Int'l Symposium on Power Semiconductor Devices and IC's (ISPSD '92)*, Tokyo, Japan, May 19–21, 1992, pp. 300–302.

* cited by examiner

*Primary Examiner*—Olik Chaudhuri
*Assistant Examiner*—Theresa T. Doan
(74) *Attorney, Agent, or Firm*—Mayer Fortkort & Williams, PC; Stuart H. Mayer, Esq.; Karin L. Williams, Esq.

(57) ABSTRACT

A trench DMOS transistor cell is provided, which is formed on a substrate of a first conductivity type. A body region, which has a second conductivity type, is located on the substrate. At least one trench extends through the body region and the substrate. An insulating layer lines the trench. The insulating layer includes first and second portions that contact one another at an interface. The first portion of the insulating layer has a layer thickness greater than the second portion. The interface is located at a depth above a lower boundary of the body region. A conductive electrode is formed in the trench so that it overlies the insulating layer. A source region of the first conductivity type is formed in the body region adjacent to the trench.

2 Claims, 3 Drawing Sheets

TRENCH DMOS TRANSISTOR HAVING A DOUBLE GATE STRUCTURE

This application is a divisional of co-pending U.S. patent application Ser No. 09/531,138, filed Mar. 17, 2000, entitled "Trench DMOS Transistor Having A Double Gate Structure".

FIELD OF THE INVENTION

The present invention relates generally to MOSFET transistors and more generally to DMOS transistors having a trench structure.

BACKGROUND OF THE INVENTION

DMOS (Double diffused MOS) transistors are a type of MOSFET (Metal On Semiconductor Field Effect Transistor) that use two sequential diffusion steps aligned to the same edge to form the transistor regions. DMOS transistors are typically employed as power transistors to provide high voltage, high current devices for power integrated circuit applications. DMOS transistors provide higher current per unit area when low forward voltage drops are required.

A typical discrete DMOS circuit includes two or more individual DMOS transistor cells which are fabricated in parallel. The individual DMOS transistor cells share a common drain contact (the substrate), while their sources are all shorted together with metal and their gates are shorted together by polysilicon. Thus, even though the discrete DMOS circuit is constructed from a matrix of smaller transistors, it behaves as if it were a single large transistor. For a discrete DMOS circuit it is desirable to maximize the conductivity per unit area when the transistor matrix is turned on by the gate. While the individual DMOS transistor cells are typically rectangular in shape, they can in general have an open or closed cell geometry.

One particular type of DMOS transistor is a so-called trench DMOS transistor in which the channel is formed vertically and the gate is formed in a trench extending between the source and drain. The trench, which is lined with a thin oxide layer and filled with polysilicon, allows less constricted current flow and thereby provides lower values of specific on-resistance. Examples of trench DMOS transistors are disclosed in U.S. Pat. Nos. 5,072,266, 5,541,425, and 5,866,931.

One example is the low voltage prior art trenched DMOS transistor shown in the cross-sectional view of FIG. 1. As shown in FIG. 1, trenched DMOS transistor 10 includes heavily doped substrate 11, upon which is formed an epitaxial layer 12, which is more lightly doped than substrate 11. Metallic layer 13 is formed on the bottom of substrate 11, allowing an electrical contact 14 to be made to substrate 11. As is known to those of ordinary skill in the art, DMOS transistors also include source regions 16a, 16b, 16c, and 16d, and body regions 15a and 15b. Epitaxial region 12 serves as the drain. Substrate 11 is relatively highly doped with N-type dopants, epitaxial layer 12 is relatively lightly doped with N type dopants, source regions 16a, 16b, 16c, and 16d are relatively highly doped with N type dopants, and body regions 15a and 15b are relatively highly doped with P type dopants. A doped polycrystalline silicon gate electrode 18 is formed within a trench, and is electrically insulated from other regions by gate dielectric layer 17 formed on the bottom and sides of the trench containing gate electrode 18. The trench extends into the heavily doped substrate 11 to reduce any resistance caused by the flow of carriers through the lightly doped epitaxial layer 12, but this structure also limits the drain-to-source breakdown voltage of the transistor. A drain electrode 14 is connected to the back surface of the substrate 11, a source electrode 22 is connected to the source regions 16 and the body regions 15, and a gate electrode 19 is connected to the polysilicon 18 that fills the trench.

In the DMOS transistor shown in FIG. 1 there is a trade-off between the device's on-resistance and its drain-to-source breakdown voltage. As the depth of the trench increases, the on-resistance decreases because an accumulation layer forms along the side-wall of the trench. However, the drain-to-source breakdown voltage decreases with increasing trench depth. This latter trend occurs because the depletion layer extending along the trench upon application of a reverse bias voltage cannot spread as the distance between the substrate and the bottom of the trench decreases. As a result, the electric field is concentrated at the bottom corner of the trench and thus breakdown occurs at this point. While the electric field can be reduced by increasing the thickness of the gate oxide layer lining the trench, this adversely effects the on-resistance of the device.

Y. Baba et al., in Proc. of ISPSD & IC, p300, 1992, discloses a trench DMOS transistor having a relatively low on-resistance and a high drain-to-source breakdown voltage. A transistor with such characteristics is accomplished by providing a double gate oxide structure that has a thicker gate oxide layer at the bottom of the trench and a thinner gate oxide layer along the side-walls of the upper portion of the trench. This arrangement provides a more optimal trade-off between the device's on-resistance and its drain-to-source breakdown voltage. Specifically, while the trench is sufficiently deep so that the on-resistance of the device is adequately low, the thickness of the gate oxide region is increased where it can most effectively reduce the electric field at the bottom of the trench; however, the remainder of the gate oxide layer has a reduced thickness so that the on-resistance is minimally impacted.

One limitation of the trench DMOS transistor shown in the previously mentioned reference is that it can be difficult to produce the double gate oxide structure, particularly at high transistor cell densities when the width of the trench becomes narrow. Another limitation of the device shown in FIG. 1 is that at high switching speeds its switching losses are relatively large because of its gate charge, which leads to increased capacitance.

Accordingly, it would be desirable to provide a trench DMOS transistor having a double gate oxide structure that is relatively simple to manufacture, particularly at high trench cell densities when the trench is narrow and which has a reduced gate charge to reduce switching losses.

SUMMARY OF THE INVENTION

In accordance with the present invention, a trench DMOS transistor cell is formed on a substrate of a first conductivity type. A body region, which has a second conductivity type, is located on the substrate. At least one trench extends through the body region and the substrate. An insulating layer lines the trench. The insulating layer includes first and second portions that contact one another at an interface. The first portion of the insulating layer has a layer thickness greater than the second portion. The interface is located at a depth above a lower boundary of the body region. A conductive electrode is formed in the trench so that it overlies the insulating layer. A source region of the first conductivity type is formed in the body region adjacent to the trench.

In accordance with one aspect of the invention, the interface is located at a depth between an upper and lower boundary of the body region.

In accordance with another aspect of the invention, the conductive electrode is formed from polysilicon. Alternatively, the conductive electrode may be formed in whole or in part from silicide.

In accordance with yet another aspect of the invention, the insulating layer is an oxide layer.

In accordance with another aspect of the invention, a trench DMOS transistor structure is provided, which includes a plurality of individual trench DMOS transistor cells formed on a substrate of a first conductivity type. Each of the individual trench DMOS transistor cells include a body region, which has a second conductivity type, located on the substrate. At least one trench extends through the body region and the substrate. An insulating layer lines the trench. The insulating layer includes first and second portions that contact one another at an interface. The first portion of the insulating layer has a layer thickness greater than the second portion. The interface is located at a depth above a lower boundary of the body region. A conductive electrode is formed in the trench so that it overlies the insulating layer. A source region of the first conductivity type is formed in the body region adjacent to the trench.

In accordance with another aspect of the invention, at least one of the individual trench DMOS transistor cells has a closed cell geometry. Alternatively, at least one of the individual trench DMOS transistor cells has an open cell geometry.

DETAILED DESCRIPTION

Figure 1:
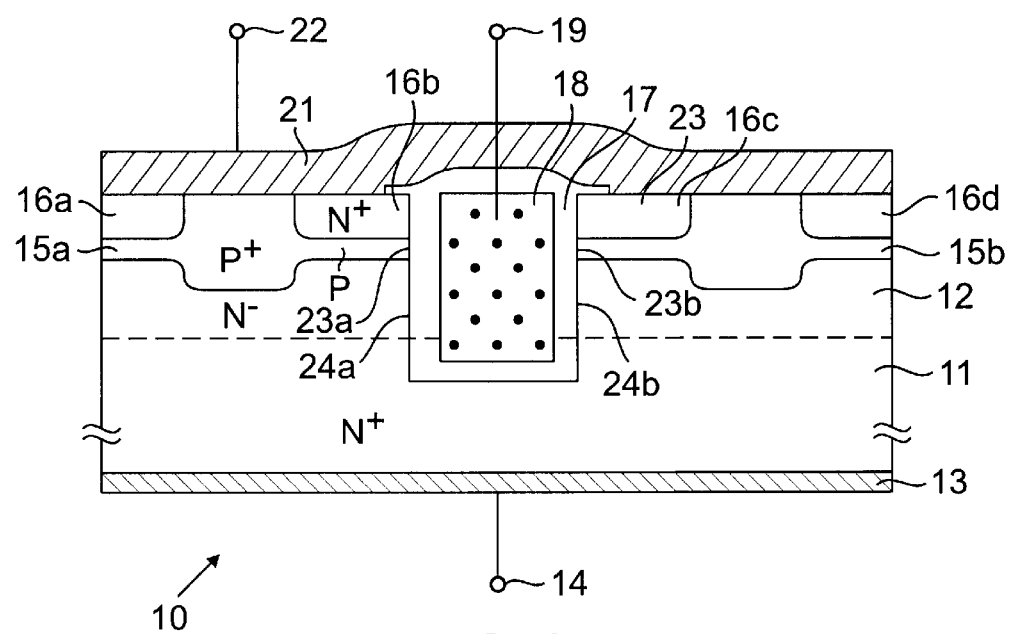
FIG. 1 shows a cross-sectional view of a conventional DMOS transistor.
Figure 2:
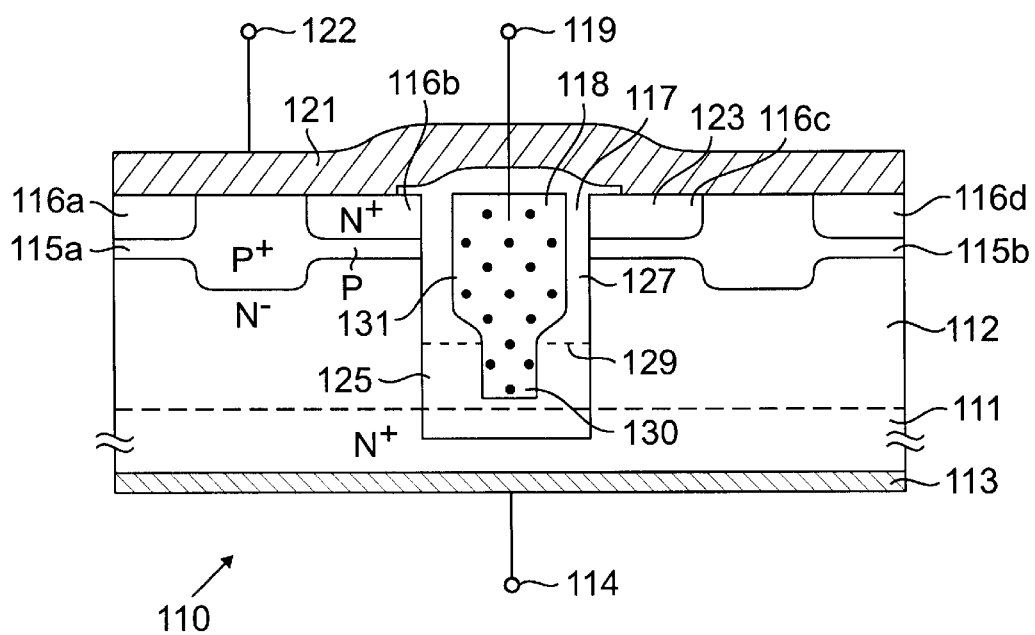
FIG. 2 shows a cross-sectional view of another conventional DMOS transistor that employs a double gate structure.

FIG. 2 shows a conventional DMOS transistor having a double oxide gate structure such as disclosed in the previously cited reference to Y. Baba et al. The trench DMOS transistor 110 includes heavily doped substrate 111 upon which is formed an epitaxial layer 112, which is more lightly doped than substrate 111. Metallic layer 113 is formed on the bottom of substrate 111, allowing an electrical contact 114 to be made to substrate 111. Metallic layer 21 is similarly formed allowing an electrical contact 22 to be made to body regions 15 and source regions 16. The DMOS transistor also includes source regions 116a, 116b, 116c, and 116d, and body regions 115a and 115b. Epitaxial region 112 serves as the drain. In the example shown in FIG. 2, substrate 111 is relatively highly doped with N-type dopants, epitaxial layer 112 is relatively lightly doped with N type dopants, source regions 116a, 116b, 116c, and 116d are relatively highly doped with N type dopants, and body regions 115a and 115b are relatively highly doped with P type dopants. A doped polycrystalline silicon gate electrode 118 is formed within a trench, and is electrically insulated from other regions by gate dielectric layer 117 formed on the bottom and sides of the trench containing gate electrode 118. The trench extends into the heavily doped substrate 111 to reduce any resistance caused by the flow of carriers through the lightly doped epitaxial layer 112. However, as previously mentioned, this structure also limits the drain-to-source breakdown voltage of the transistor. This problem is alleviated in FIG. 2 by increasing the thickness of the gate oxide layer in the bottom portion of the trench to define thick oxide layer 125 and decreasing its thickness in the upper portion of the trench to define thin oxide layer 127. As shown, the interface 129 between the thick gate oxide layer 125 and the thin gate oxide layer 127 is located in epitaxial region 112. As a result of this structure, the electric field at the bottom of the trench is reduced, thus increasing the drain-to-source breakdown voltage, while the on-resistance of the device remains low because the thick gate oxide layer 125 does not extend throughout the entire trench. Finally, the device is completed in a conventional manner by connecting a drain electrode 114 to the back surface of the substrate 111, connecting a source electrode 122 to the source regions 116 and the body regions 115, through a conventional metallization layer 121, and connecting a gate electrode 119 to the polysilicon 118 that fills the trench.

The double gate structure shown in FIG. 2 is fabricated by the following process steps. First, the trench is etched after the source regions 116 and body regions 115 have been formed in epitaxial region 112 by diffusion. Next, the thick gate oxide layer 125 is deposited by chemical vapor deposition (CVD) followed by deposition of a first polysilicon layer 130 adjacent to the trench. The thick oxide layer 125 is then etched back to a depth below the body regions to define interface 129. Finally, the thin oxide layer 127 is deposited followed by deposition of a second polysilicon layer 131. First and second polysilicon layers 130 and 131 constitute gate electrode 118.

The step of etching back the thick gate oxide layer 125 becomes problematic for narrow and deep trenches. That is, etching is difficult when the trench has a high aspect ratio. This problem arises because a wet etch is employed and it becomes difficult to continuously refresh the etchant in a deep trench. For instance, it is not feasible to form the gate structure shown in FIG. 2 for trenches having a width less than about 0.5 microns.

Figure 3:
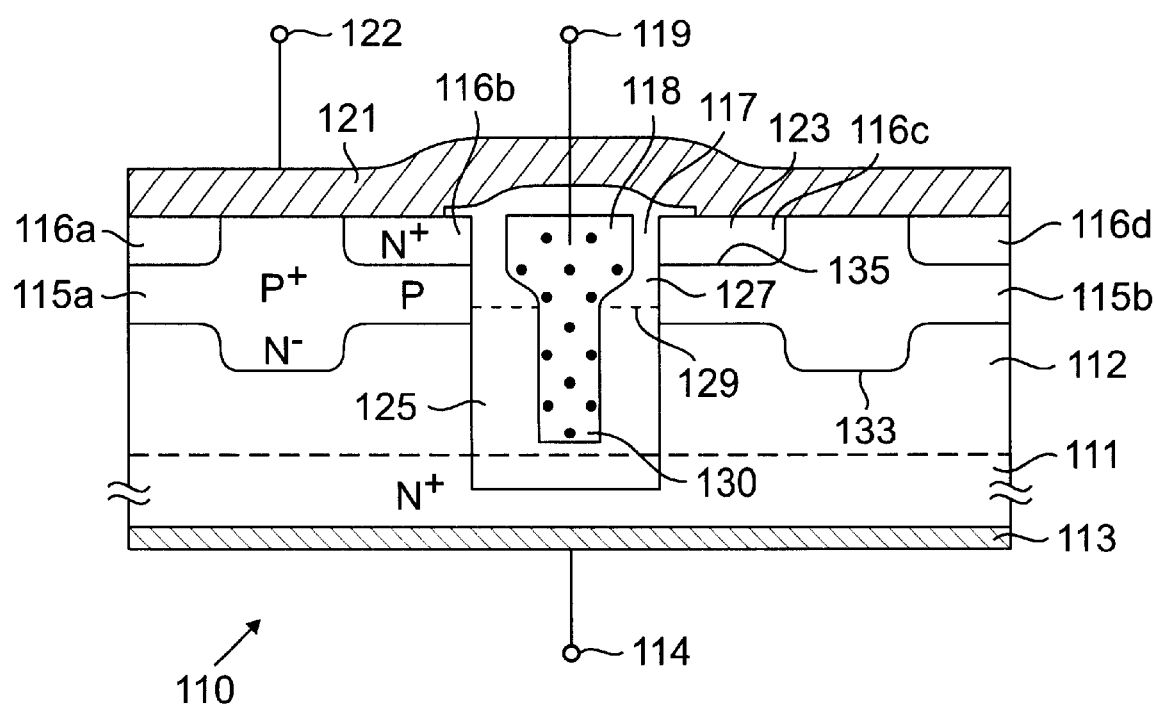
FIG. 3 shows a cross-sectional view of one embodiment of the DMOS transistor constructed in accordance with the present invention.

The present inventors have discovered that this fabrication problem can be alleviated by modifying the double gate structure shown in FIG. 2 so that the interface 129 between the thick and thin gate oxide layers is located at a depth above the bottom of the body regions 115a and 115b. FIG. 3 shows an exemplary embodiment of the invention. In FIGS. 2 and 3 like elements are denoted by like reference numerals. More specifically, in the embodiment of the invention shown in FIG. 3 the interface 129 is located at a depth between the top boundary 135 of the body region 115 and a bottom boundary 133 of the body region 115. In other words, the location of interface 129 in the inventive structure is adjusted so that the thick gate oxide layer 125 does not need to be etched back to an impractical depth when forming the thin oxide layer 127. In contrast to the structure shown in FIG. 3, the prior art structure shown in FIG. 2 locates the interface 129 at a depth corresponding to epitaxial layer 112 rather than the body regions 115a and 115b.

The present invention is easier to fabricate than the prior art structure because the portion of the thick oxide layer 125 that must be etched back to allow formation of the thin oxide layer 127 does not extend as deep within the trench. Accordingly, the problems associated with etching the thick oxide layer that arise when the trench has a high aspect ratio are reduced so that in the present invention the trench can be made correspondingly narrower before etching problems arise. In addition, the inventors have surprisingly found that the inventive structure offers a more optimal trade-off between its on-resistance and drain-to-source breakdown voltage. Most significantly, a primary advantage of the present invention is that because the portion of the total gate oxide layer occupied by the thick oxide layer 125 is increased relative to the prior art structure shown in the FIG. 2, the gate to drain charge of the device and hence its capacitance is reduced without adversely effecting the on-resistance. As previously mentioned, this advantageously reduces switching losses in the device.

The inventive DMOS device shown in FIG. 3 may be fabricated in accordance with any conventional processing technique. In particular, the double gate structure may be fabricated in accordance with the process steps set forth above in connection with the FIG. 2 structure and disclosed in the Y. Baba et al. reference. In this reference, when the thin oxide layer 127 is formed, the thick oxide layer 125 is etched back until it is eliminated and then a subsequent oxide layer is deposited to form thin oxide layer 127. While the present invention may employ this technique, it may also employ an alternative technique in which the thick oxide layer 127 is etched back just enough to form the thin oxide layer 125. In this way a second oxide deposition step is avoided and both oxide layers 125 and 127 are formed in a single deposition.

Figure 4:
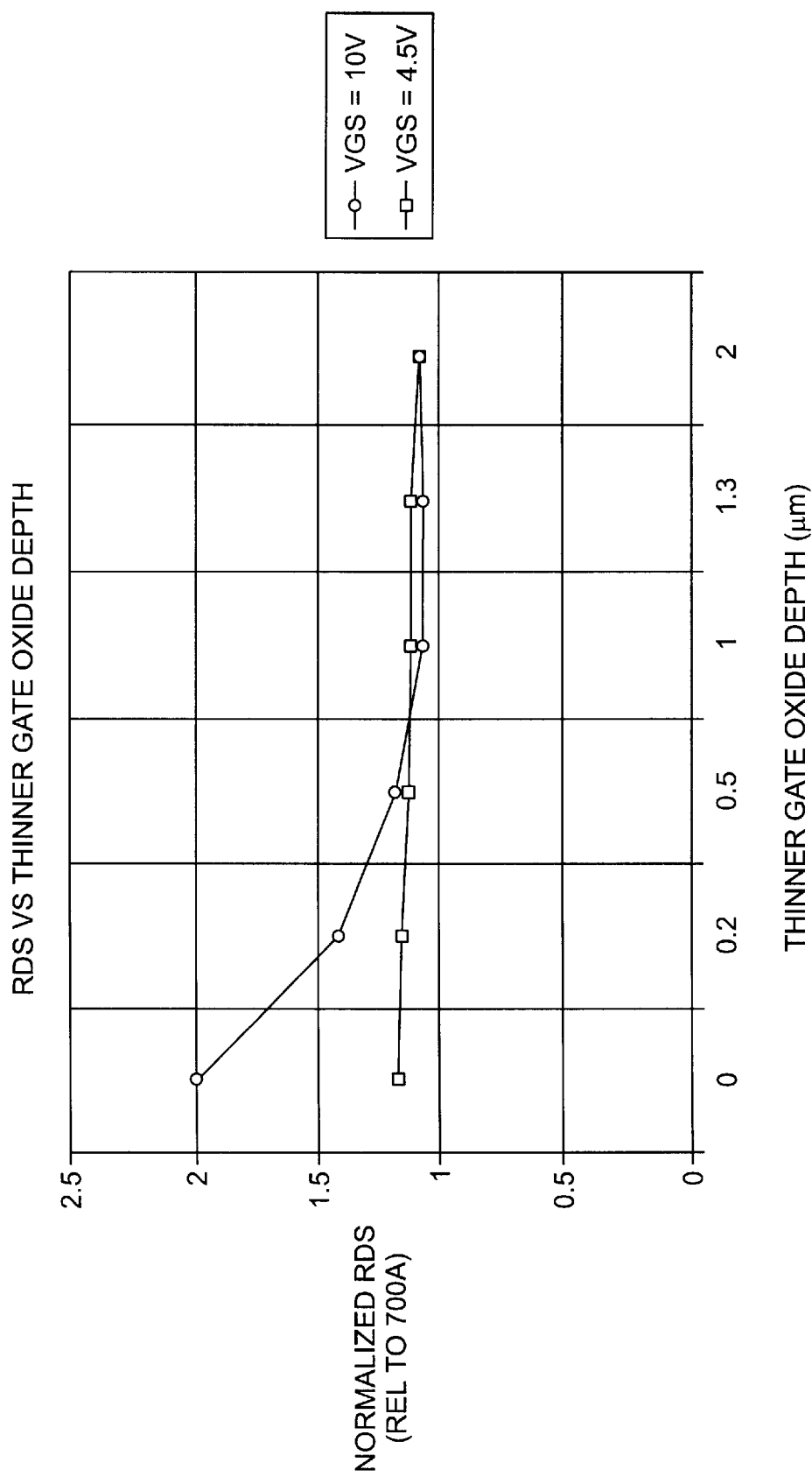
FIG. 4 is a simulation showing the on-resistance for the DMOS transistor shown in FIG. 3 when the reverse bias applied between the gate and source is 10 V and 4.5 V.

FIG. 4 is the result of a simulation that was performed showing the on-resistance (normalized to a uniform oxide layer 700 angstroms thick) for the inventive structure when the gate bias applied between the gate and source is 10 V and 4.5 V. In FIG. 4 the abscissa represents the location of the interface 129 in a trench that is 2 microns deep. That is, a depth of zero corresponds to a structure having no thin oxide layer and a depth of 2 microns corresponds to a structure having no thick oxide layer. FIG. 4 shows that there is little benefit from locating the interface at a depth below the body region 115 because below this level the on-resistance does not substantially decrease in comparison to when the interface is located at a depth between the top and boundary and bottom boundaries 135 and 133 of the body region 115. If the interface is located above the top boundary 135 of the body region, however, the on-resistance significantly increases at low gate-to-source voltages.

In an alternative embodiment of the invention, the second polysilicon layer 131 of the gate electrode, which is deposited after the thin gate oxide layer 127, is formed from silicide rather than polysilicon. Alternatively, the first polysilicon layer 130 or even both polysilicon layers 130 and 131 may be replaced with silicide. Silicide is advantageously employed because of its reduced resistance relative polysilicon and hence it contributes to a reduction in switching losses. This configuration increases the switching speed of the resulting device.

Although various embodiments are specifically illustrated and described herein, it will be appreciated that modifications and variations of the present invention are covered by the above teachings and are within the purview of the appended claims without departing from the spirit and intended scope of the invention. For example, the method of the present invention may be used to form a trench DMOS in which the conductivities of the various semiconductor regions are reversed from those described herein.

What is claimed is:

1. A method for forming a trench DMOS, comprising the steps of:
    a) providing an article comprising a substrate of a first conductivity type and a body region of a second conductivity type, said article having a trench which extends through said body region and said substrate;
    b) depositing a first insulating layer in the trench, said insulating layer including side portions along each side of the trench and a bottom portion along a bottom of the trench,
    c) depositing a first conductive electrode layer,
    d) etching, after step c), a portion of said first insulating layer to define, in each side portion, first and second portions of the insulating layer, wherein the first and second portions of each side portion contact one another at an interface, said first portion having a uniform layer thickness greater than said second portion, said interface being located at a depth above a lower boundary of the body region;
    e) depositing a second conductive electrode in the trench, over said first conductive electrode layer, said first and second conductive electrode layers forming a conductive electrode; and
    f) forming a source region of the first conductivity type in the body region.

2. The method of claim 1 wherein said insulating layer is deposited so that said interface is located at a depth between an upper and lower boundary of the body region.

* * * * *